United States Patent
Wang

(10) Patent No.: US 11,652,114 B2
(45) Date of Patent: May 16, 2023

(54) OPTIMAL PHOTON MANAGEMENT FOR CMOS SENSORS

(71) Applicant: Coherent AI (Hong Kong) Limited, Kowloon (HK)

(72) Inventor: Xingze Wang, Durham, NC (US)

(73) Assignee: Coherent AI (Hong Kong) Limited, Kowloon (HK)

( * ) Notice: Subject to any disclaimer, the term of this patent is extended or adjusted under 35 U.S.C. 154(b) by 176 days.

(21) Appl. No.: 17/117,489

(22) Filed: Dec. 10, 2020

(65) Prior Publication Data
US 2022/0190010 A1     Jun. 16, 2022

(51) Int. Cl.
*H01L 27/146*     (2006.01)

(52) U.S. Cl.
CPC .... *H01L 27/14607* (2013.01); *H01L 27/1463* (2013.01); *H01L 27/14605* (2013.01); *H01L 27/14621* (2013.01); *H01L 27/14627* (2013.01)

(58) Field of Classification Search
None
See application file for complete search history.

(56) References Cited

U.S. PATENT DOCUMENTS

| | | | | |
|---|---|---|---|---|
| 4,514,582 A | * | 4/1985 | Tiedje | H01L 31/02366 136/258 |
| 10,411,053 B2 | | 9/2019 | Yokogawa | |
| 2018/0151759 A1 | * | 5/2018 | Huang | H01L 31/0232 |
| 2018/0350853 A1 | | 12/2018 | Huang et al. | |
| 2019/0027517 A1 | | 1/2019 | Huang et al. | |
| 2019/0148570 A1 | * | 5/2019 | Wu | H01L 27/14685 257/187 |
| 2019/0165026 A1 | | 5/2019 | Kuo et al. | |

(Continued)

FOREIGN PATENT DOCUMENTS

| | | |
|---|---|---|
| CN | 107146819 A | 9/2017 |
| CN | 108183112 A | 6/2018 |

(Continued)

OTHER PUBLICATIONS

Yu et al., "Nanophotonic light-trapping theory for solar cells", Applied Physics A, Sep. 28, 2011, 105:329-339, Springer.

(Continued)

*Primary Examiner* — Ali Naraghi
(74) *Attorney, Agent, or Firm* — Chen Yoshimura LLP

(57) ABSTRACT

A CMOS sensor includes a silicon material having a surface periodic structure of silicon portions and non-silicon portions, formed by multiple supercells repeated in a 2-dimensional lattice pattern. Each image pixel of the sensor has at least 2×2 supercells. The lattice constants in both lateral directions are within a range defined by a wavelength of the light to be sensed. Within each supercell, the non-silicon portions create an effective refractive index for the light that changes gradually with depth. The non-silicon portions within the supercell have lateral feature sizes smaller the wavelength of the light to be sensed, and vertical feature sizes larger than the wavelength of the light to be sensed. In some examples, each supercell includes at least two inverted pyramids having different base sizes and/or different heights. A dielectric material fills the non-silicon portions of the periodic structure and covers the silicon material.

20 Claims, 3 Drawing Sheets

(56) References Cited

U.S. PATENT DOCUMENTS

| | | |
|---|---|---|
| 2019/0371835 A1 | 12/2019 | Huang et al. |
| 2020/0006407 A1* | 1/2020 | Yokogawa ............ H01L 27/146 |
| 2020/0006410 A1* | 1/2020 | Wu ................... H01L 27/14685 |
| 2020/0020816 A1 | 1/2020 | Huang et al. |
| 2020/0058684 A1 | 2/2020 | Wu et al. |
| 2020/0083389 A1 | 3/2020 | Wu et al. |
| 2020/0083390 A1 | 3/2020 | Wu et al. |
| 2020/0111923 A1 | 4/2020 | Huang et al. |
| 2020/0194473 A1 | 6/2020 | Yokogawa |

FOREIGN PATENT DOCUMENTS

| | | |
|---|---|---|
| CN | 108987419 A | 12/2018 |
| CN | 109786402 A | 5/2019 |
| CN | 109841641 A | 6/2019 |
| CN | 110838499 A | 2/2020 |

OTHER PUBLICATIONS

Yokogawa et al., "IR sensitivity enhancement of CMOS Image Sensor with diffractive light trapping pixels", Scientific Reports, Jun. 19, 2017, pp. 1-9, 7:3832.

Wang et al., "Absorption Enhancement in Ultrathin Crystalline Silicon Solar Cells with Antireflection and Light-Trapping Nanocone Gratings", Nano Letters, Feb. 22, 2012, pp. 1616-1619, 12.

Liu et al., "S4: A free electromagnetic solver for layered periodic structures," Computer Physics Communications, 2012, pp. 2233-2244, 183.

* cited by examiner

OPTIMAL PHOTON MANAGEMENT FOR CMOS SENSORS

BACKGROUND OF THE INVENTION

Field of the Invention

This invention relates to light absorbers, and in particular, it relates to infrared CMOS image sensors and other CMOS sensors.

Description of Related Art

CMOS (Complementary Metal Oxide Semiconductor) image sensors are used in a wide range of image sensing applications, including infrared (IR) and near-IR imaging. Pixel sizes for CMOS image sensors can be a few microns or smaller. Various techniques have been proposed to improve light absorption by CMOS sensors, particularly in the near-IR range where absorption by crystalline silicon (c-Si) is relatively low. For example, S. Yokogawa et al., IR sensitivity enhancement of CMOS Image Sensor with diffractive light trapping pixels, Scientific Reports, 7:3832 (2017) (hereinafter "Yokogawa et al."), describes "IR sensitivity enhancement of back-illuminated CMOS Image Sensor (BI-CIS) with 2-dimensional diffractive inverted pyramid array structure (IPA) on crystalline silicon (c-Si) and deep trench isolation (DTI) . . . . A prototype BI-CIS sample with pixel size of 1.2 μm square containing 400 nm pitch IPAs shows 80% sensitivity enhancement at $\lambda$=850 nm compared to the reference sample with flat surface. This is due to diffraction with the IPA and total reflection at the pixel boundary." (Yokogawa et al., Abstract.)

FIG. 3 of Yokogawa et al., adapted as FIG. 3 of this application, illustrates three samples of CMOS sensor pixels. In Sample a, the pixels have a flat Si surface with anti-reflection (AR) coating. Sample b is similar to Sample a, but the Si surface of each CMOS pixels has a 3×3 IPA with a pitch of 400 nm. Sample c is similar to Sample a, but has DTI between pixels. In each sample, each CMOS pixel is covered with an on-chip color filter (red, green or blue) and an on-chip micro lens. Yokogawa et al. describes the working principle of the light trapping pixel as follows: "Because of the high refractive index of c-Si and low refractive index of surround medium such as $SiO_2$, it is possible to effectively confine the light within the pixel cube. Firstly, incident light is refracted with the c-Si surface (111) which has facet angle of 54.7° by following Snell's law. Then the refracted light is reflected at the side-wall and bottom of c-Si. Because of large gap of refractive index of c-Si and $SiO_2$, it is easy to fulfill the total reflection condition, and results in large optical-path elongation compared to the case of flat surface." (Id., p. 7.)

Similar technology is also described in U.S. Pat. Appl. Pub. Nos. 20200006407 and 20200194473, and U.S. patent Ser. No. 10/411,053.

SUMMARY

The present invention is directed to a CMOS image sensor or other CMOS sensors that substantially obviates one or more of the problems due to limitations and disadvantages of the related art.

An object of the present invention is to provide a CMOS image sensor with improved light absorption.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve the above objects, the present invention provides a CMOS (Complementary Metal Oxide Semiconductor) sensor for sensing a light, which includes: a silicon material having a periodic structure formed in a surface layer, the periodic structure including silicon portions and non-silicon portions, wherein the periodic structure includes a plurality of supercells repeated according to a 2-dimensional lattice pattern, the supercell being a smallest unit of the periodic structure, wherein lattice constants of the 2-dimensional lattice pattern in both lateral directions are within a range defined by a wavelength of the light to be sensed, wherein within each supercell, a total area of the non-silicon portions at a given depth from a top of the periodic structure is a monotonically or near-monotonically decreasing function of the depth, wherein lateral feature sizes of the non-silicon portions within the supercell are smaller than a lower end of a wavelength range of the light to be sensed, and wherein vertical feature sizes of the non-silicon portions within the supercell are larger than an upper end of the wavelength range of the light to be sensed; and a dielectric material filling the non-silicon portions of the periodic structure and covering the silicon material.

In some embodiments, the non-silicon portions of each supercell include at least two inverted pyramids, the at least two inverted pyramids having different base sizes and/or different heights.

In another aspect, the present invention provides a CMOS image sensor for sensing a light, which includes: a silicon material defining a plurality of image pixels, each pixel having a periodic structure formed in a surface layer, the periodic structure including silicon portions and non-silicon portions, wherein the periodic structure includes a plurality of supercells repeated according to a 2-dimensional lattice pattern, including at least two supercells in each of two lateral directions of the lattice pattern, the supercell being a smallest unit of the periodic structure, wherein lattice constants of the 2-dimensional lattice pattern in both lateral directions are within a range defined by a wavelength of the light to be sensed, wherein within each supercell, a total area of the non-silicon portions at a given depth from a top of the periodic structure is a monotonically or near-monotonically decreasing function of the depth, wherein lateral feature sizes of the non-silicon portions within the supercell are smaller than a lower end of a wavelength range of the light to be sensed, and wherein vertical feature sizes of the non-silicon portions within the supercell are larger than an upper end of the wavelength range of the light to be sensed; and a dielectric material filling the non-silicon portions of the periodic structure and covering the silicon material.

In another aspect, the present invention provides a CMOS image sensor for sensing a light, which includes: a silicon material defining a plurality of image pixels, each pixel having a periodic structure formed in a surface layer, the periodic structure including silicon portions and non-silicon portions, wherein the periodic structure includes a plurality of supercells repeated according to a 2-dimensional lattice pattern, including at least two supercells in each of two lateral directions of the lattice pattern, the supercell being a smallest unit of the periodic structure, wherein lattice constants of the 2-dimensional lattice pattern in both lateral directions are within a range defined by a wavelength of the light to be sensed, wherein the non-silicon portions of each supercell include at least two inverted pyramids having different base sizes and/or different heights, wherein a base size of each inverted pyramid in each of the two lateral directions is smaller than the lower end of the wavelength range of the light to be sensed, and a height of each inverted pyramid is larger than the upper end of the wavelength range of the light to be sensed; and a dielectric material filling the non-silicon portions of the periodic structure and covering the silicon material.

It is to be understood that both the foregoing general description and the following detailed description are exemplary and explanatory and are intended to provide further explanation of the invention as claimed.

DETAILED DESCRIPTION OF PREFERRED EMBODIMENTS

Figure 3:
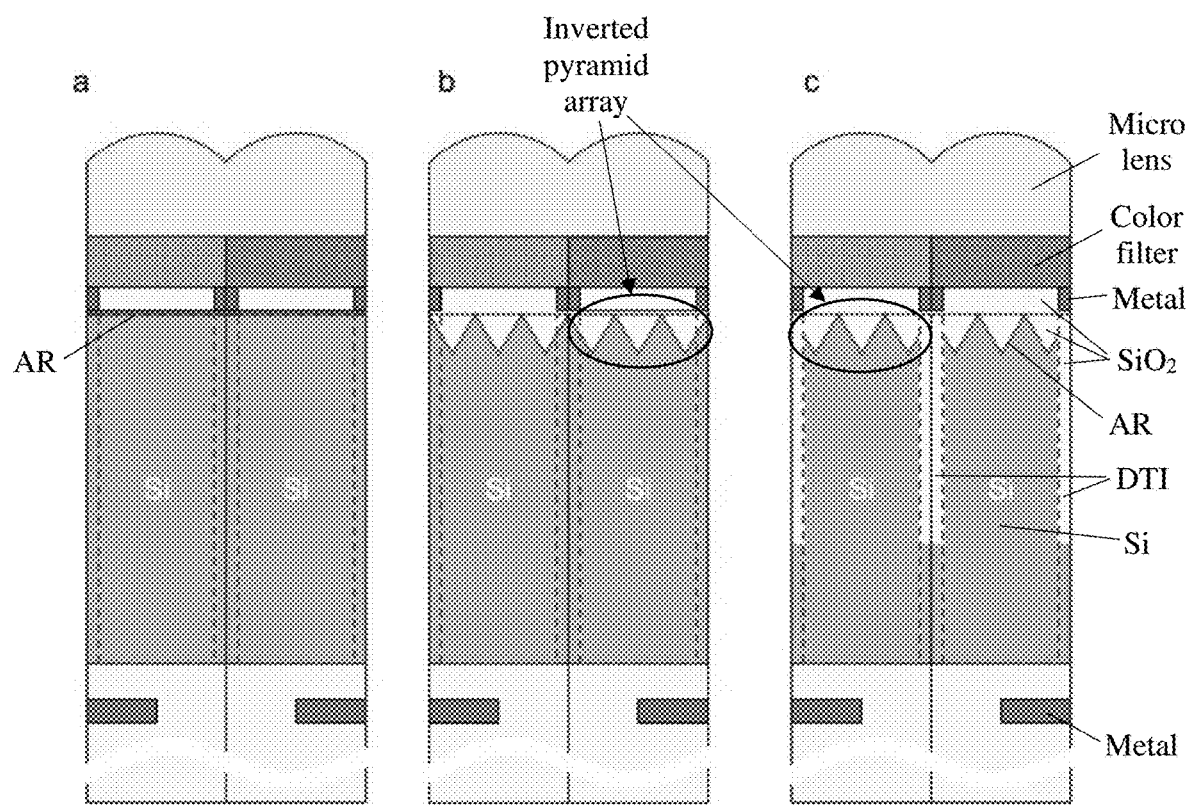
FIG. 3 schematically illustrates the structures of CMOS image sensor pixels with an inverted pyramid array structure on the silicon surface according to known technologies.

In the CMOS image sensor pixels shown in FIG. 3 of Yokogawa et al., the inverted pyramid array structure for each pixel has uniformly sized inverted pyramids.

According to embodiments of the present invention, an inverted pyramid array structure is formed on the silicon surface of each pixel of the CMOS image sensor, where the inverted pyramid array has inverted pyramids of at least two different lateral sizes and/or at least two different heights. The inverted pyramids are volumes of non-silicon voids, which will be filled with a dielectric material such as $SiO_2$.

More broadly, according to embodiments of the present invention, a CMOS sensor includes a silicon material, where a periodic structure of silicon portions and non-silicon portions is formed in a surface layer of the silicon material. The units of the periodic structure, referred to as supercells, are repeated according to a 2-dimensional lattice pattern to form the periodic structure. The supercell is a smallest unit of the periodic structure, and cannot be further divided into smaller sub-units that repeat periodically within the supercell. Each supercell (all supercells are identical to each other) includes at least two inverted pyramids that have different lateral sizes and/or different heights, or other structures that satisfy a number of requirements described below.

Each pixel of the CMOS image sensor is covered by at least two supercells in each of the lateral directions (e.g., X and Y directions). As mentioned earlier, pixel sizes of CMOS sensors may be on the order of 1 μm. More generally, the inverted pyramid array structure can be applied to the silicon surface of other CMOS sensors, not limited to image sensors with individual pixels. In cases where no individual pixels are defined, the supercells are repeated according to the 2-d lattice pattern such that within a silicon area of on the order of 1 μm by 1 μm in size (e.g., an area of 0.5 μm by 0.5 μm to 3 μm by 3 μm in size), there are at least two supercells in each of the lateral directions.

According to embodiments of the present invention, the general geometrical requirements for the periodic structure formed on the silicon surface of the CMOS sensor, for achieving both effective antireflection and effective light trapping, include the following.

Lattice constant: The lattice constants, in both lateral directions, of the 2-d lattice that define the arrangement of the supercells are approximately of the same order of magnitude as the wavelength of the light to be sensed by the sensor. For example, the lattice constants satisfies the following: $0.5\lambda < L < 1.5\lambda$, where L is either one of the lattice constants and $\lambda$ is a representative wavelength of the light to be sensed (e.g., the center of the wavelength range). It should be noted that the preferred or optimum range of the lattice constant is dependent on the shape of the 2-d lattice. For example, the preferred range will be different for a triangular lattice as compared to a square or rectangular lattice. For a square lattice, the lattice constant should be near and slightly below the upper end of the wavelength range of the light to be sensed ($\lambda_{max}$), such as $L \approx 0.95\lambda_{max}$. This requirement of the lattice constant primarily determines the light trapping effectiveness of the silicon.

Structure within each supercell: The structure within each supercell primarily determines the antireflection effectiveness of the silicon. Within each supercell, the silicon portions and non-silicon portions provide a spatially averaged effective n (refractive index) that changes gradually in the depth direction (Z). Stated generally, the total area of the non-silicon portions within the supercell at a given depth (distance from the top of the silicon surface), as a function of depth, is a monotonically or near-monotonically decreasing function. Near-monotonically decreasing means that some local increases in the function are permitted so long as a moving average of the function, using a window of a defined size, remains monotonically decreasing. The non-silicon area vs. depth function is preferably a smooth function; the first derivative of this function is preferably within a defined range, and the second derivative is preferably below a defined value. Thus, for example, a steep S shape is not desirable. Step functions, which are not smooth and thus may not give optimal results, may nevertheless be suitable in practice because such structures are relatively easy to fabricate.

Figure 1:
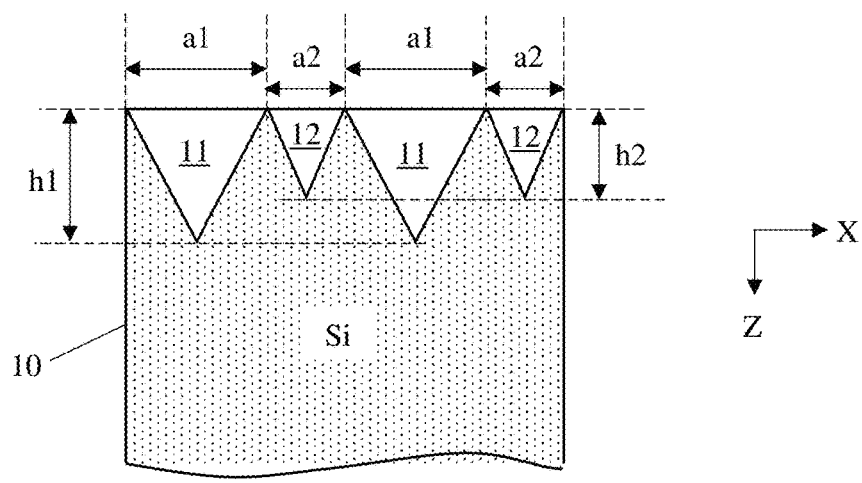
FIG. 1 is a schematic side cross-sectional view that illustrates the structures of a CMOS image sensor pixel with an inverted pyramid array structure having two or more different sized inverted pyramids according to an embodiment of the present invention.

As long as the above requirements are met, the silicon and non-silicon portions within the supercell are not required to have any specific shape. For example, the lateral cross-sectional shape of the non-silicon portions at a given depth is not limited to any particular shape, and these non-silicon portions are not required to be physically connected. A preferred supercell structure that satisfies the above requirements is formed of two or more inverted pyramids having different lateral sizes and/or different heights. Each inverted pyramid is not required to have any specific shape. For example, the tip of the inverted pyramid may be aligned with the center of the base of the inverted pyramid, or not aligned with the center of the base of the inverted pyramid (referred to as an oblique pyramid). The sides of the inverted pyramid in vertical cross-sectional views may be straight as shown in FIG. 1, or curved. The lateral cross-sectional shape of the inverted pyramid at any given depth may be similar to dissimilar to the base shape of the pyramid, etc.

Lateral feature size of the non-silicon portions within each supercell: In order for the non-silicon portions to create an effective refractive index as experienced by the incoming light, the lateral feature sizes of the non-silicon areas within the supercell are smaller than the wavelength of the light to be sensed (e.g., smaller than the lower end of the wavelength range of the light to be sensed). Generally speaking, the smaller the lateral feature sizes, the better. Here, lateral feature sizes refer to lateral sizes of contiguous non-silicon portions at a given depth. When the supercell is formed of two or more inverted pyramids side by side, the above lateral feature size requirement may be satisfied by limiting the base size of the inverted pyramids. Preferably, the base size (in both lateral directions) of the inverted pyramids are smaller than the lower end of the wavelength range of the light to be sensed.

Vertical feature size of the non-silicon portions within each supercell: The heights of the non-silicon portions within the supercell are larger than the wavelength of the light to be sensed. Generally speaking, the larger the height, the better. Preferably, the heights of the non-silicon portions are larger than the upper end of the wavelength range of the light to be sensed. When the supercell is formed of two or more inverted pyramids, the above vertical feature size requirement may be satisfied by requiring the heights of all inverted pyramids to be greater than the upper end of the wavelength range of the light to be sensed.

It should be noted here that the wavelength range of the light to be sensed refers to the wavelength range that the CMOS sensor is optimized to sense. The actual light falling on the sensor may include other wavelengths that the sensor is not optimized to sense.

A preferred periodic structure that meets the above requirements is an inverted pyramid array having at least two types of pyramids of different sizes (base sizes and/or heights). Some specific examples of such inverted pyramid arrays are described below.

Referring to FIG. 1 (side cross-sectional view in the X-Z plane), a pixel 10 of a CMOS image sensor has an inverted pyramid array on the silicon surface that includes multiple (two in this example) first inverted pyramids 11 having a first size and multiple (two in this example) second inverted pyramids 12 having a second size. The first size is different from the second size either in the base size (i.e. the size of the base of the inverted pyramid) in one or both lateral (e.g. X and/or Y) directions, or in the height in the vertical (Z) direction, or both. In the example shown in FIG. 1, the first inverted pyramids 11 has a height h1 and an X-direction width a1, and the second inverted pyramids 12 has a height h2 and an X-direction width a2, where a1≠a2 and h1≠h2. Each first inverted pyramid 11 and an adjacent second inverted pyramid 12 belong to a supercell, the supercells being arranged in a periodic manner; the inverted pyramid array for each pixel 10 has two supercells in the X direction in this example. There may be gaps between adjacent inverted pyramids within each supercell or between adjacent supercells, or no gaps.

Figures 2A, 2B:
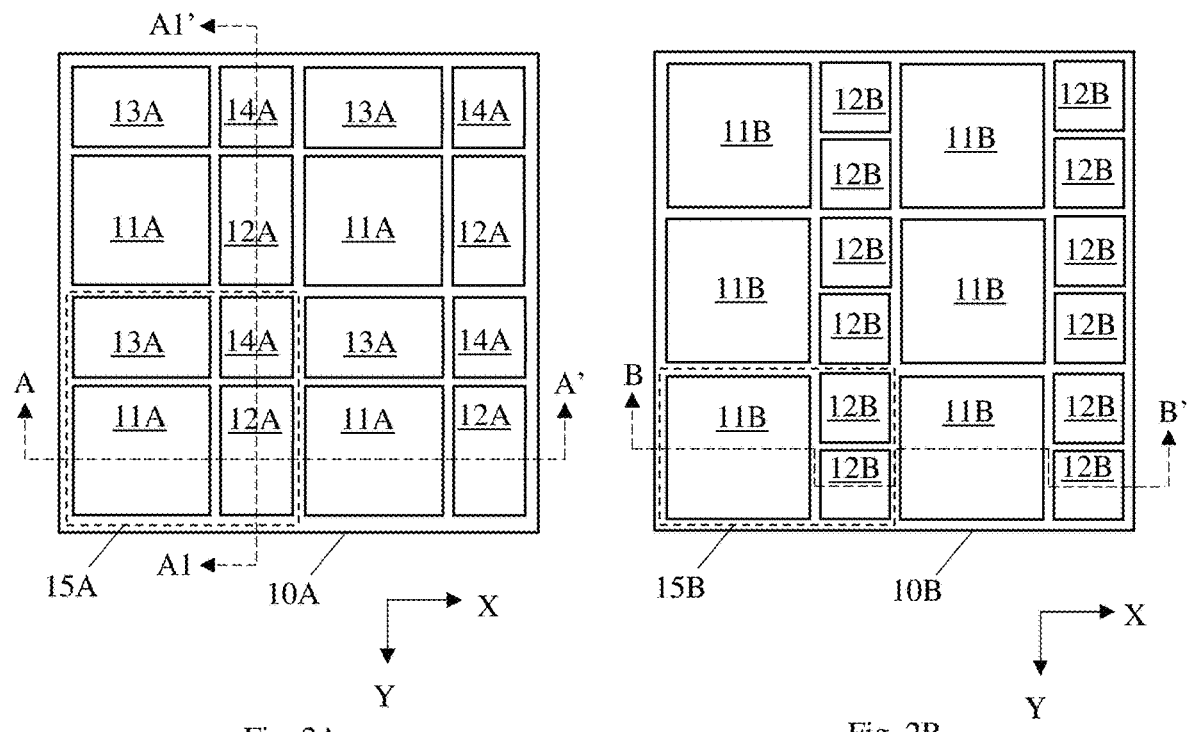
FIGS. 2A, 2B and 2C are schematic top views illustrating three exemplary structures of CMOS image sensor pixels, each having an inverted pyramid array structure with two or more different sized inverted pyramids, according to embodiments of the present invention.
Figure 2C:
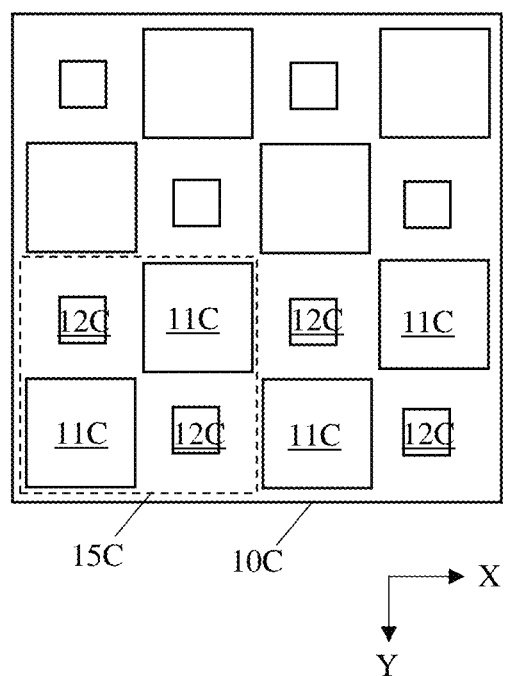

In the top view (X-Y plane), the inverted pyramids of different sizes may be arranged to form supercells in various ways, and the supercells are repeated to form the periodic structure. Some examples are shown in FIGS. 2A, 2B and 2C, but the invention is not limited to any particular spatial arrangements. In the example shown in FIG. 2A, the inverted pyramid array includes inverted pyramids of four different lateral sizes, namely, inverted pyramids 11A, 12A, 13A and 14A. Each set of four inverted pyramids 11A, 12A, 13A and 14A form a supercell 15A with two rows and two columns of inverted pyramids, as indicated by the dashed line box. Four supercells are shown in this example, repeated according to a 2×2 square lattice. Thus, there are sixteen inverted pyramids forming four columns and four rows on the surface of the pixel 10A of the CMOS image sensor. More specifically, in this example, inverted pyramids 11A and 12A have the same Y-direction width and are arranged alternately in the X-direction; inverted pyramids 13A and 14A have the same Y-direction width and are arranged alternately in the X-direction; inverted pyramids 11A and 13A have the same X-direction width and are arranged alternately in the Y-direction; and inverted pyramids 12A and 14A have the same X-direction width and are arranged alternately in the Y-direction. In this example, the cross-sectional view shown in FIG. 1 may represent a cross-section cut along the dashed line A-A', or a cross-section cut along the dashed line A1-A1' (in which case the inverted pyramids represented in FIG. 1 would be 12A and 14A), etc. In alternative embodiments, the positions of the inverted pyramids 11A and 12A may be switched, or the positions of the inverted pyramids 13A and 14A may be switched, or the positions of the inverted pyramids 11A and 13A may be switched, or the positions of the inverted pyramids 12A and 14A may be switched.

In the example shown in FIG. 2B, the inverted pyramid array for the pixel 10B includes inverted pyramids of two different lateral sizes, namely, inverted pyramids 11B and 12B. Each larger inverted pyramid 11B and two adjacent smaller inverted pyramids 12B form a supercell 15B, as indicated by the dashed line box. Six supercells are shown in this example, repeated according to a 2×3 rectangular lattice. Thus, there are eighteen inverted pyramids on the pixel 10B, where inverted pyramids 11B form Y-direction columns and inverted pyramids 12B form Y-direction columns, and the two columns are arranged alternately. In this example, the cross-sectional view shown in FIG. 1 may represent a cross-section cut along the dashed line B-B', and the inverted pyramids represented in FIG. 1 would be 11B and 12B.

Note that FIGS. 2A and 2B show the gaps between the inverted pyramids for ease of illustration, but gaps may or may not exist within the inverted pyramid array.

In the example shown in FIG. 2C, the inverted pyramid array for the pixel 10C includes inverted pyramids of two different lateral sizes, namely, inverted pyramids 11C and 12C, arranged such that the different sized inverted pyramids alternate in both the X and Y directions. Each set of two larger inverted pyramids 11C and two smaller inverted pyramids 12C form a supercell 15C, as indicated by the dashed line box. Four supercells are shown in this example, repeated according to a 2×2 square lattice. Note that in this arrangement, gaps are present between adjacent pyramids, which is inevitable in this example due to the design of the supercell.

It should be noted that although gaps are permitted in the inverted pyramids arrays in embodiments of the present invention, unnecessary gaps are generally not desirable.

In the examples illustrated in FIGS. 2A-2C, the shape of the base of the inverted pyramids are squares or rectangles. In other examples, the base of the inverted pyramids may be of other shapes, such as parallelograms, other polygons, circles, ovals, etc. or their combinations, and the invention is not limited to any particular base shapes. The overall shape of the supercell and the 2-d lattice are not limited to those in the illustrated examples either. Moreover, the arrangement of the imaging pixels of the CMOS image sensor itself is not required to be square or rectangular. For example, the pixel arrangement may be hexagonal, in which case the inverted pyramids may correspondingly have hexagonal or other base shapes and the 2-d lattice may be a triangle lattice.

In summary, according to some embodiments of the present invention, the lateral arrangements of the inverted pyramids of different sizes are not limited to any particular arrangements, as long as, for each pixel of the image sensor, (i) the inverted pyramid array is a periodic structure formed of supercells repeated according to a 2-d lattice, where each supercell includes inverted pyramids of at least two different sizes, and (ii) there are at least two supercells in each of the lateral directions over each pixel (or over an area on the order of 1 μm by 1 μm in size in cases if individual pixels do not exist). For designs for a specific application, optimization may be performed to determine suitable inverted pyramid arrangements; the optimal results may be with or without gaps.

The working principles of the inverted pyramid array structure according to embodiments of the present invention are as follows.

Assume that the base size (assuming a square shape for simplicity) and the height of an inverted pyramid structure are a and h, respectively. If an inverted pyramid array structure having uniformly sized inverted pyramids is used, the geometrical requirements for achieving both antireflection and light trapping would be (where $\lambda$ is the representative wavelength of the light to be sensed):

(1) a<$\lambda$, for incoming light to experience a spatially averaged effective refractive index;

(2) h>$\lambda$, to facilitate a gradual transition of refractive indices from air to silicon;

(3) a>$\lambda$, to support a large number of guided resonances leading to light absorption;

(4) a<$\lambda$, to allow a small number of channels through which radiation leaks to air.

It would be difficult for an inverted pyramid array structure having uniformly sized inverted pyramids to satisfy all of the above geometrical requirements, as light trapping and antireflection are independent physical phenomena. Based on this insight, the inventor of this application invented the CMOS sensor having a surface silicon structure that satisfies the requirements described earlier, and more specifically, an inverted pyramid array structure that includes inverted pyramids of at least two different sizes as described above. Such an inverted pyramid array structure has advantages for both enhanced antireflection and enhanced light trapping, thus enhancement the quantum efficiency of the CMOS sensor.

More specifically, in the exemplary inverted pyramid array illustrated in FIG. 1, let L be the X-direction lattice constant of the 2-d lattice of the periodic structure. In this example, L=a1+a2, which is the size of the supercell because the inverted pyramids are tightly packed without gaps, but this is not required. The geometrical requirements for achieving both effective antireflection and effective light trapping are:

(5) L~$\lambda$, for effective light trapping;
(6) a1<$\lambda$ and a2<$\lambda$, for effective antireflection;
(7) h1>$\lambda$ and h2>$\lambda$; and
(8) a1≠a2 and/or h1≠h2.

Here, "L~$\lambda$" means that the lattice constant L is of the same order of magnitude as k.

The last requirement, a1≠a2 and/or h1≠h2, serves to ensure that the supercell formed by the two inverted pyramids 11 and 12 is the smallest unit of the periodic structure and cannot be divided into smaller sub-units that repeat periodically within the supercell. If the size differences between the two different inverted pyramids 11 and 12 are too small, the two inverted pyramids will effectively become the same size and form a pseudo periodic structure, so the supercells will no longer be the smallest unit of the periodic structure. To avoid this problem, preferably, the difference in sizes (base size and/or height) of the two inverted pyramids should be larger than the typical fabrication tolerance of the silicon structure. Generally speaking, the larger the size differences, the better.

Similar to the CMOS image sensor described in Yokogawa et al., in embodiments of the present invention, deep trench isolation between image pixels may be employed.

The inverted pyramid array structure having two or more differently sized inverted pyramids may be fabricated using any suitable semiconductor processing techniques. For example, the inverted pyramid structures may be made using either etching (e.g., reactive-ion etching) or growing. The process may be similar to that described in Yokogawa et al. but with different base pillars to start the etching with, depending on the base shape.

Figure 4:
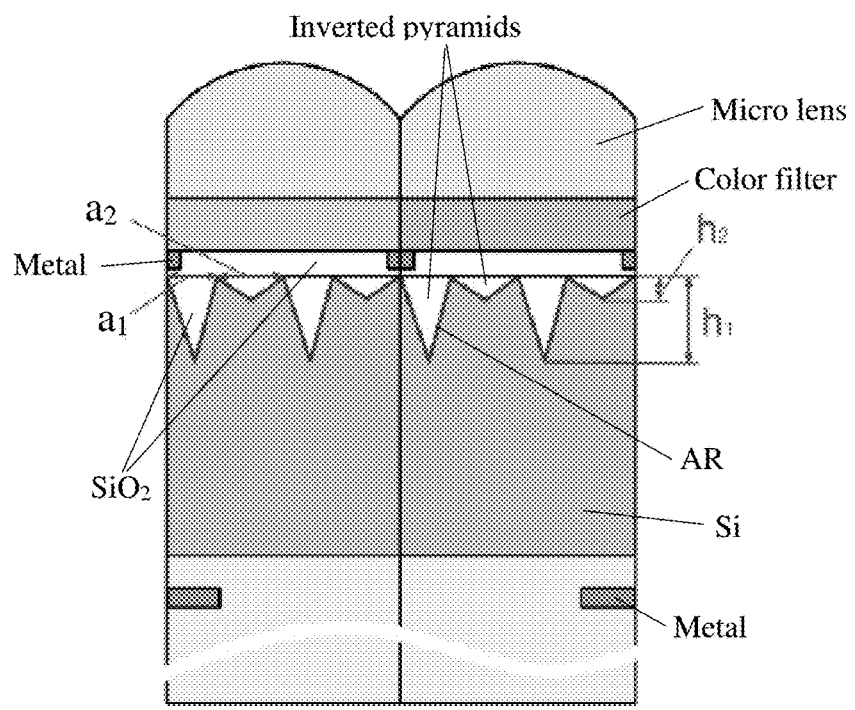
FIG. 4 schematically illustrates the structure of a CMOS sensor according to embodiments of the present invention.

FIG. 4 schematically illustrates the structure of a CMOS sensor according to embodiments of the present invention. In addition to the surface silicon structure such as that shown in FIG. 1, the sensor has other components similar to those described in Yokogawa et al. (see FIG. 3), such as electrodes (metal), a dielectric medium such as $SiO_2$ that fills the inside of the inverted pyramids (the non-silicon portions) and the deep trench isolation (if present) and covers the silicon structure, an optionally, on-chip color filter (red, green or blue) and an on-chip micro lens covering each CMOS pixel, etc. In some embodiments, an antireflection (AR) layer is provided over the silicon, similar to that described in Yokogawa et al. (see FIG. 3); in other embodiments, no AR layer is provided over the silicon.

Embodiments of the present invention provide improved light absorbers, for example and without limitation, infrared CMOS image sensors for wavelengths at 850 nm, 940 nm, etc.

The inventors conducted simulations which showed that the absorption for CIS pixels can be significantly improved by using an IPA structure with multiple different sized inverted pyramids as compared to using an IPA structure with uniform sized inverted pyramids. In the simulations, the silicon structure was assumed to be a 2D semi-infinite Si substrate in air, which means there is no reflection or diffraction from the bottom boundary. Three sample structures were simulated, the first having a flat silicon surface, the second having a surface IPA structure with uniform sized inverted pyramids similar to that shown in sample B of FIG. 3, and the third having a surface IPA structure with two different sized inverted pyramids in each supercell similar to that shown in FIGS. 1 and 4. In all three sample structures, each pixel was assumed to be a 6 μm width square, equipped with proper on-chip micro-lens and on-chip color filter of equal sizes, and the thickness of each photo detector was 3 μm. The IPA pitch in the second sample was 400 nm, that is to say, each inverted pyramid had a base of a=400 nm length, and a height of h=566 nm (=2/tan 54.7° *a). After simulating for the third sample, one preferred configuration was found to be: the first inverted pyramid having a base length of a1=825 nm and a height of h1=1400 nm, and the second inverted pyramid having a base length of a2=275 nm and a height of h2=175 nm. In the simulation, it was assumed that the Si substrates were all in air and the IPAs on the surface (if present) were filled with air as well, with incident light perpendicular to the interface between air and Si. Simulations were done for the three samples to calculate the absorption enhancements of the second and third samples relative to the first sample, in a wavelength range of 400 nm to 1000 nm. The 2D simulation result showed that, for example, at 800 nm, the absorption was enhanced by nearly 10 times more in the third sample as compared to second sample.

For the third sample, simulations were carried out to calculate absorption enhancement under various combinations of parameters a1, a2, h1, h2, to obtain the preferred values of these parameters described above.

The simulations were done using the Rigorous Coupled Wave Analysis (RCWA) method. In particular, a software program described in a paper by Victor Liu and Shanhui Fan, "S4: A free electromagnetic solver for layered periodic structures," Computer Physics Communications 183, 2233-2244 (2012), was used to perform the simulations.

Although the simulations were done for 2D silicon structures filled with air, 3D silicon structures filled with $SiO_2$ can be simulated using similar principles.

The sensor structure described above may be used to detect or absorb electromagnetic waves in wavelength ranges other than visible and IR light. The structure may also be used for energy absorbers, such as solar cells, which are usually not considered "sensors". In this disclosure and the appended claims, the term "energy absorber" is used to broadly refer to sensors (including image sensors), solar cells, and any other sensing and energy harvesting devices that rely on absorption to sense or harvest. The periodic structure described in this disclosure may be adapted for used in any such energy absorbers.

The periodic structure described in this disclosure may further be adapted to form a sensor or absorber of sound wave, with suitable adjustments and modifications of the underlying material and geometrical parameters of the periodic structures. The same working principles described above apply to these other sensors or absorbers.

It will be apparent to those skilled in the art that various modification and variations can be made in the CMOS sensor structure of the present invention without departing from the spirit or scope of the invention. Thus, it is intended that the present invention cover modifications and variations that come within the scope of the appended claims and their equivalents.

What is claimed is:

1. An energy absorber for absorbing an electromagnetic wave, comprising:
   a semiconductor material having a periodic structure formed in a surface layer, the periodic structure including semiconductor portions and non-semiconductor portions,
   wherein the periodic structure includes a plurality of supercells repeated according to a 2-dimensional lattice pattern, the supercell being a smallest unit of the periodic structure,
   wherein lattice constants of the 2-dimensional lattice pattern in both lateral directions are within a range defined by a wavelength of the electromagnetic wave to be absorbed,
   wherein within each supercell, a total area of the non-semiconductor portions at a given depth from a top of the periodic structure is a monotonically or near-monotonically decreasing function of the depth, wherein lateral feature sizes of the non-semiconductor portions within the supercell are smaller than a lower end of a wavelength range of the electromagnetic wave to be absorbed, and wherein vertical feature sizes of the non-semiconductor portions within the supercell are larger than an upper end of the wavelength range of the electromagnetic wave to be absorbed; and
   a dielectric material filling the non-semiconductor portions of the periodic structure and covering the semiconductor material.

2. The energy absorber of claim 1, wherein the energy absorber is a sensor and the semiconductor material is silicon.

3. The energy absorber of claim 2, wherein the energy absorber is an image sensor and the silicon material defines a plurality of pixels, and wherein the periodic structure for each pixel includes at least two supercells in each of the two lateral directions of the surface.

4. The energy absorber of claim 2, wherein the periodic structure has at least two supercells in each of the two lateral directions of the surface within a surface area of 0.5 μm by 0.5 μm to 3 μm by 3 μm in size.

5. The energy absorber of claim 1, wherein the range defined by a wavelength of the electromagnetic wave to be absorbed is $0.5\lambda < L < 1.5\lambda$, where L is the lattice constant in either one of the lateral directions and $\lambda$ is a representative wavelength of the electromagnetic wave to be absorbed.

6. The energy absorber of claim 1, wherein the non-semiconductor portions of each supercell include at least two inverted pyramids, the at least two inverted pyramids having different base sizes and/or different heights.

7. The energy absorber of claim 6, wherein a base size of each inverted pyramid in each of the two lateral directions is smaller than the lower end of the wavelength range of the electromagnetic wave to be absorbed.

8. The energy absorber of claim 6, wherein a height of each inverted pyramid is larger than the upper end of the wavelength range of the electromagnetic wave to be absorbed.

9. The energy absorber of claim 6, wherein each supercell includes four inverted pyramids in a 2×2 arrangement, including a first inverted pyramid having a base length of a first value and a base width of a second value, a second inverted pyramid having a base length of a third value and a base width of the second value, a third inverted pyramid having a base length of the first value and a base width of a fourth value, and a fourth inverted pyramid having a base length of the third value and a base width of the fourth value.

10. The energy absorber of claim 1, wherein the energy absorber is an image sensor and the semiconductor material is a silicon material which defines a plurality of pixels, wherein the silicon material further defines deep trench isolations between pixels, and wherein the dielectric material fills the deep trench isolations, and wherein the image sensor further comprises a color filter and an on-chip micro lens above each pixel.

11. A CMOS (Complementary Metal Oxide Semiconductor) image sensor for sensing an electromagnetic wave, comprising:
   a silicon material defining a plurality of image pixels, each pixel having a periodic structure formed in a surface layer, the periodic structure including silicon portions and non-silicon portions,
   wherein the periodic structure includes a plurality of supercells repeated according to a 2-dimensional lattice pattern, including at least two supercells in each of two lateral directions of the lattice pattern, the supercell being a smallest unit of the periodic structure,
   wherein lattice constants of the 2-dimensional lattice pattern in both lateral directions are within a range defined by a wavelength of the electromagnetic wave to be sensed, wherein within each supercell, a total area of the non-silicon portions at a given depth from a top of the periodic structure is a monotonically or near-monotonically decreasing function of the depth, wherein lateral feature sizes of the non-silicon portions within the supercell are smaller than a lower end of a wavelength range of the electromagnetic wave to be sensed, and wherein vertical feature sizes of the non-silicon portions within the supercell are larger than an upper end of the wavelength range of the electromagnetic wave to be sensed; and a dielectric material filling the non-silicon portions of the periodic structure and covering the silicon material.

12. The CMOS sensor of claim 11, wherein the range defined by a wavelength of the electromagnetic wave to be sensed is $0.5\lambda < L < 1.5\lambda$, where L is the lattice constant in either one of the lateral directions and $\lambda$ is a representative wavelength of the electromagnetic wave to be sensed.

13. The CMOS sensor of claim 11, wherein the non-silicon portions of each supercell include at least two inverted pyramids, the at least two inverted pyramids having different base sizes and/or different heights.

14. The CMOS sensor of claim 13, wherein a base size of each inverted pyramid in each of the two lateral directions is smaller than the lower end of the wavelength range of the electromagnetic wave to be sensed.

15. The CMOS sensor of claim 13, wherein a height of each inverted pyramid is larger than the upper end of the wavelength range of the electromagnetic wave to be sensed.

16. The CMOS sensor of claim 13, wherein each supercell includes four inverted pyramids in a 2×2 arrangement, including a first inverted pyramid having a base length of a first value and a base width of a second value, a second inverted pyramid having a base length of a third value and a base width of the second value, a third inverted pyramid having a base length of the first value and a base width of a fourth value, and a fourth inverted pyramid having a base length of the third value and a base width of the fourth value.

17. The CMOS sensor of claim 11, wherein the silicon material further defines deep trench isolations between pixels, and wherein the dielectric material fills the deep trench isolations, and wherein the CMOS sensor further comprises a color filter and an on-chip micro lens above each pixel.

18. A CMOS (Complementary Metal Oxide Semiconductor) image sensor for sensing an electromagnetic wave, comprising:

a silicon material defining a plurality of image pixels, each pixel having a periodic structure formed in a surface layer, the periodic structure including silicon portions and non-silicon portions, wherein the periodic structure includes a plurality of supercells repeated according to a 2-dimensional lattice pattern, including at least two supercells in each of two lateral directions of the lattice pattern, the supercell being a smallest unit of the periodic structure, wherein lattice constants of the 2-dimensional lattice pattern in both lateral directions are within a range defined by a wavelength of the electromagnetic wave to be sensed, wherein the non-silicon portions of each supercell include at least two inverted pyramids having different base sizes and/or different heights, wherein a base size of each inverted pyramid in each of the two lateral directions is smaller than the lower end of the wavelength range of the electromagnetic wave to be sensed, and a height of each inverted pyramid is larger than the upper end of the wavelength range of the electromagnetic wave to be sensed; and a dielectric material filling the non-silicon portions of the periodic structure and covering the silicon material.

19. The CMOS sensor of claim 18, wherein the range defined by a wavelength of the electromagnetic wave to be sensed is $0.5\lambda < L < 1.5\lambda$, where L is the lattice constant in either one of the lateral directions and $\lambda$ is a representative wavelength of the electromagnetic wave to be sensed.

20. The CMOS sensor of claim 18, wherein the silicon material further defines deep trench isolations between pixels, and wherein the dielectric material fills the deep trench isolations, and wherein the CMOS sensor further comprises a color filter and an on-chip micro lens above each pixel.

* * * * *